US010825665B2

(12) United States Patent
Godet et al.

(10) Patent No.: US 10,825,665 B2
(45) Date of Patent: Nov. 3, 2020

(54) DIRECTIONAL TREATMENT FOR MULTI-DIMENSIONAL DEVICE PROCESSING

(71) Applicant: Applied Materials, Inc., Santa Clara, CA (US)

(72) Inventors: Ludovic Godet, Sunnyvale, CA (US); Huixiong Dai, San Jose, CA (US); Srinivas D. Nemani, Sunnyvale, CA (US); Ellie Y. Yieh, San Jose, CA (US); Nitin Krishnarao Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/703,922

(22) Filed: May 5, 2015

(65) Prior Publication Data
US 2015/0325411 A1 Nov. 12, 2015

Related U.S. Application Data

(60) Provisional application No. 61/989,405, filed on May 6, 2014.

(51) Int. Cl.
*H01J 37/32* (2006.01)
*H01J 37/305* (2006.01)
*H01J 37/317* (2006.01)

(52) U.S. Cl.
CPC .. *H01J 37/32899* (2013.01); *H01J 37/32357* (2013.01); *H01J 37/32366* (2013.01);
(Continued)

(58) Field of Classification Search
None
See application file for complete search history.

(56) References Cited

U.S. PATENT DOCUMENTS 5,273,588 A * 12/1993 Foster ............... C23C 16/455
118/715
5,628,828 A * 5/1997 Kawamura ......... C23C 16/4412
118/719
(Continued)

FOREIGN PATENT DOCUMENTS

JP 2002-353112 A 12/2002
KR 10-0493878 6/2005
(Continued)

OTHER PUBLICATIONS

PCT Notification of Transmittal of the International Search Report and the Written Opinion of the International Searching Authority for International Application No. PCT/US2015/018877 dated May 29, 2015; 10 total pages.
(Continued)

*Primary Examiner* — Karla A Moore
(74) *Attorney, Agent, or Firm* — Patterson + Sheridan, LLP

(57) ABSTRACT

Embodiments of the disclosure include apparatus and methods for modifying a surface of a substrate using a surface modification process. The process of modifying a surface of a substrate generally includes the alteration of a physical or chemical property and/or redistribution of a portion of an exposed material on the surface of the substrate by use of one or more energetic particle beams while the substrate is disposed within a particle beam modification apparatus. Embodiments of the disclosure also provide a surface modification process that includes one or more pre-modification processing steps and/or one or more post-modification processing steps that are all performed within one processing system.

19 Claims, 10 Drawing Sheets

(52) U.S. Cl.
CPC .. *H01J 37/32422* (2013.01); *H01J 37/32715* (2013.01); *H01J 37/32733* (2013.01); *H01J 37/3056* (2013.01); *H01J 37/3171* (2013.01); *H01J 37/32412* (2013.01); *H01J 2237/06* (2013.01); *H01J 2237/245* (2013.01); *H01J 2237/334* (2013.01)

(56) References Cited

U.S. PATENT DOCUMENTS

| | | | |
|---|---|---|---|
| 6,054,390 | A | 4/2000 | Liu et al. |
| 6,288,357 | B1 | 9/2001 | Dyer |
| 6,365,506 | B1* | 4/2002 | Chang ............... H01L 21/76811 |
| | | | 257/E21.579 |
| 6,624,430 | B2 | 9/2003 | Higuchi |
| 7,675,047 | B2 | 3/2010 | Radovanov et al. |
| 7,928,406 | B2 | 4/2011 | Horsky et al. |
| 8,618,515 | B2 | 12/2013 | Sentoku |
| 9,453,279 | B2* | 9/2016 | Ruffell ............... C23C 16/45536 |
| 2004/0053498 | A1* | 3/2004 | Kaji ................. H01L 21/76823 |
| | | | 438/687 |
| 2004/0222082 | A1 | 11/2004 | Gopalraja et al. |
| 2008/0038908 | A1* | 2/2008 | Henley ................. H01J 37/185 |
| | | | 438/530 |
| 2010/0140077 | A1* | 6/2010 | Koo ........................ H01J 37/08 |
| | | | 204/164 |
| 2010/0252531 | A1* | 10/2010 | Godet ..................... C23C 16/50 |
| | | | 216/67 |
| 2010/0255655 | A1* | 10/2010 | Mallick ............. H01L 21/02126 |
| | | | 438/435 |
| 2011/0174770 | A1 | 7/2011 | Hautala |
| 2011/0223732 | A1 | 9/2011 | Griebenow et al. |
| 2012/0071003 | A1* | 3/2012 | Dobashi .................. C23C 14/02 |
| | | | 438/758 |
| 2012/0104274 | A1 | 5/2012 | Hirayanagi et al. |
| 2012/0248328 | A1* | 10/2012 | Renau ..................... H01J 7/024 |
| | | | 250/398 |
| 2012/0258600 | A1* | 10/2012 | Godet ................... H01L 21/306 |
| | | | 438/705 |
| 2014/0273502 | A1* | 9/2014 | Hatem .................... H01L 43/12 |
| | | | 438/758 |

FOREIGN PATENT DOCUMENTS

| | | |
|---|---|---|
| TW | 499499 B | 8/2002 |
| TW | 200515485 A | 5/2005 |
| TW | 200522198 A | 7/2005 |
| TW | 201215250 A | 4/2012 |
| TW | 201318040 A | 5/2013 |

OTHER PUBLICATIONS

U.S. Appl. No. 14/641,071 entitled Grazing Angle Plasma Processing for Modifying a Substrate Surface in the name of Ludovic Godet, et al.; filed Mar. 6, 2015; 66 total pages.

International Search Report and Written Opinion for International Application No. PCT/US2015/027618 dated Jul. 31, 2015.

Taiwan Office Action dated Oct. 18, 2018 for Application No. 104113954.

Taiwan Office Action for Application No. 108108232 dated Jan. 21, 2020.

\* cited by examiner

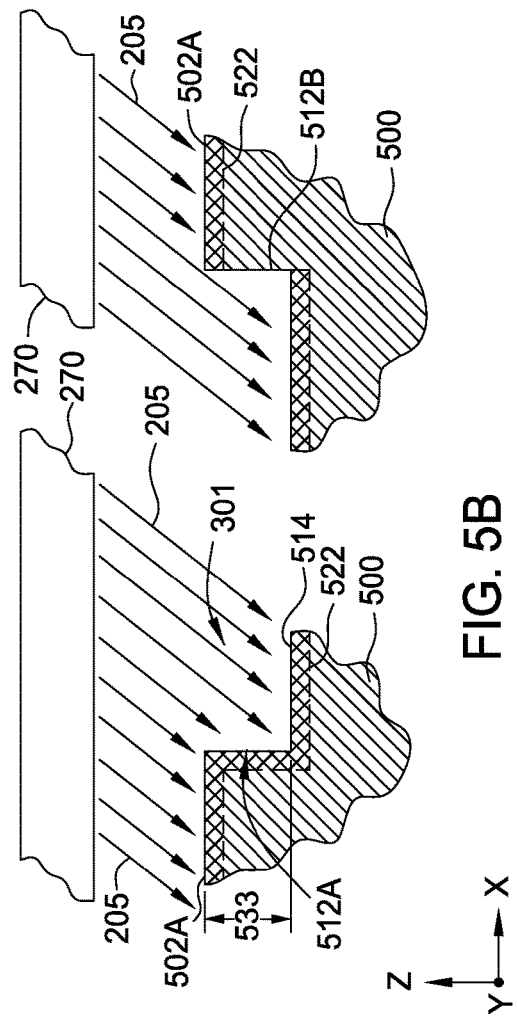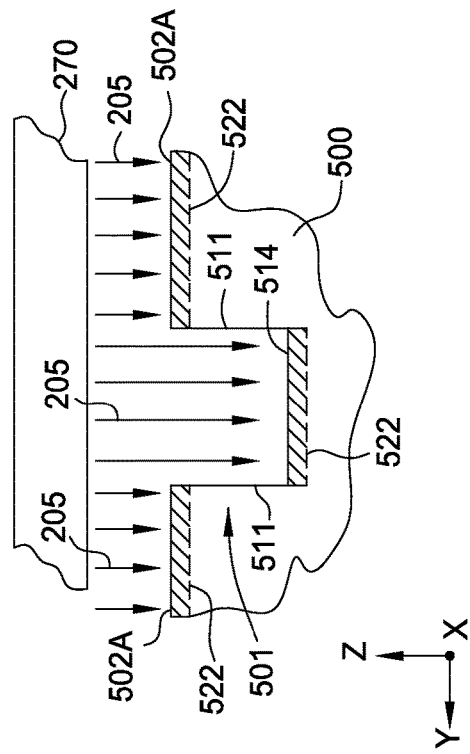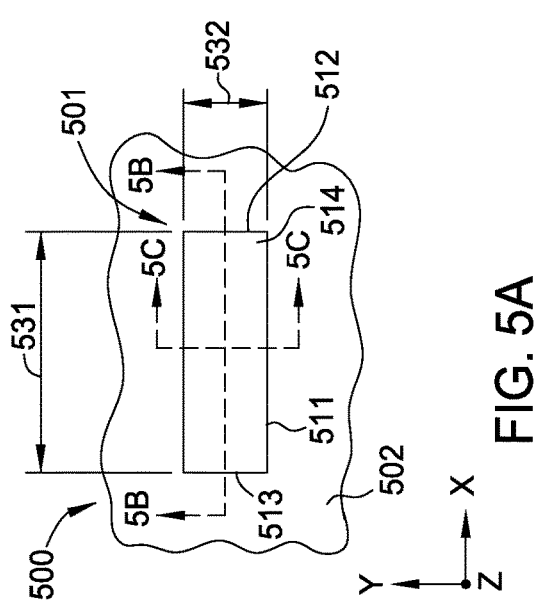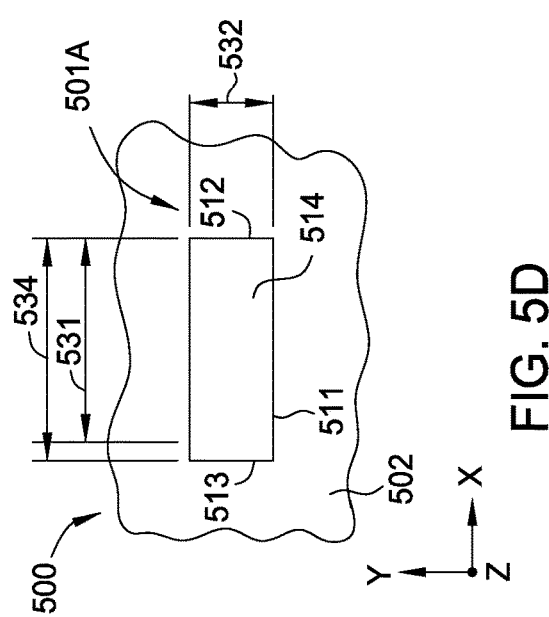

DIRECTIONAL TREATMENT FOR MULTI-DIMENSIONAL DEVICE PROCESSING

CROSS-REFERENCE TO RELATED APPLICATIONS

This application claims priority to U.S. Provisional Patent Application Ser. No. 61/989,405, filed on May 6, 2014, which herein is incorporated by reference.

BACKGROUND

Field

Embodiments of the disclosure provided herein generally relate to apparatus and methods for selectively processing one or more surfaces of a substrate.

Description of the Related Art

Shrinking integrated circuits (ICs) may result in improved performance, increased capacity and/or reduced cost. Each device shrink requires more sophisticated techniques to form the features. Photolithography is commonly used to pattern features on a substrate. An exemplary feature is a line of a material which may be a metal, semiconductor or insulator. The line width is the width of the line and the spacing is the distance between adjacent lines. Pitch is defined as the distance between a same location on two neighboring lines. The pitch is equal to the sum of the line width and the spacing. Due to various factors including the stepper radiation wavelength, photolithography techniques have a minimum pitch below which a particular photolithographic technique may not reliably form features. The minimum pitch of any given photolithographic technique can limit feature size reduction.

Self-aligned double patterning (SADP) is one method for extending the capabilities of photolithographic techniques beyond their supposed minimum pitch. Such a method is illustrated in FIGS. 1A-G, which is one type of SADP process that is commonly called a "positive tone" process flow. With reference to FIG. 1A, patterned features 111 are formed from sacrificial structural material above a surface of a substrate 100 using standard photo-lithography and etching techniques. The patterned features 111 are referred to as placeholders, mandrels or cores and have line widths and/or spacings near the optical resolution of a photolithography system using a high-resolution photomask. As shown in FIG. 1B, a conformal layer 130 of hard mask material is subsequently deposited over cores 111. Hard mask spacers or ribs 131 are then formed on the sides of cores 111 by preferentially etching the hard mask material from the horizontal surfaces with an anisotropic spacer etch. The resulting structures of the partially formed device are shown in FIG. 1C (side cross-sectional view) and FIG. 1D (top view). A standard photo-lithography patterning layer 135 is then formed over the resulting structures, as illustrated in FIG. 1E, and the exposed regions outside of the patterning layer 135 are removed by etching techniques. Cores 111 may then be removed, leaving behind hard mask spacers 131 (FIG. 1F (side view) and FIG. 1G (top view)) having a new feature spacing set at least partially by the thickness of the deposited hard mask material. At this point hard mask spacers 131 may be used as an etch mask for patterning the substrate and subsequently removed at the end of the positive tone process flow. With either positive or negative tone process flows, the density of features is twice that of the photo-lithographically patterned features. In the figures, the pitch of hard mask spacers or ribs 131 is half the pitch of patterned features 111. The process flows outlined above decrease the pitch along one dimension, however, generally require at least two lithography steps to form the structure (e.g., prior to FIG. 1A and illustrated in FIG. 1E). While increasing the number of steps within the formation sequence, the cost of the processing sequence and the chance of misprocessing substrates, it is desirable to create an alternate process flow that removes the extra lithographic processing step(s).

Therefore, there is a need for a method and apparatus that can selectively treat regions of a substrate such that the treated regions, or untreated regions, can be selectively removed during subsequent wet or dry processing steps.

SUMMARY

The present disclosure generally includes apparatus and methods for selectively modifying regions of a surface using a plasma treatment process. A process of plasma modifying a surface of a substrate generally includes the directional delivery of various elemental species to an exposed surface of the substrate by use of an energetic particle beam while the substrate is disposed within a particle beam modification apparatus. In some embodiments, the plasma treatment of a portion of an exposed surface of a substrate may be performed by use of a particle beam modification process that is performed in a sub-atmospheric pressure processing environment. The particle beam modification process may include the delivery of an energetic particle beam that includes a spatially localized group of energetic particles that are directed towards a surface of a substrate for a desired period of time to achieve a desired dose.

Embodiments of the disclosure also provide apparatus for modifying a surface of a substrate, comprising a substrate support having a substrate supporting surface, a first particle beam source assembly configured to generate a first particle beam that is directed in a first direction, wherein the first particle beam is directed towards the substrate supporting surface and the first direction is at a first grazing angle relative to a second direction that is normal to the substrate supporting surface, and an actuator that is configured to translate the substrate supporting surface relative to the first and the second particle beams in a third direction, wherein the third direction is at an angle to a plane that contains the first direction. In some cases, the angle may be about 90° and the substrate supporting surface may also be maintained in a fixed orientation relative to the first direction. The apparatus may further comprise an inspection module that is configured to determine an orientation of a substrate and provide information relating to the determined orientation to a system controller, wherein the system controller is configured to cause the substrate to be positioned on the substrate supporting surface in an orientation relative to the first direction based on the provided information.

Embodiments of the disclosure also provide a method of modifying a surface of a substrate in a processing region of a processing chamber, comprising delivering a first particle beam towards a surface of a substrate, wherein the first particle beam is directed in a first direction that is at a first grazing angle relative to a second direction that is perpendicular to the substrate, translating the substrate relative to the first particle beam, comprising moving the substrate in a second direction that is at an angle to first direction, and delivering a process gas to the surface to preferentially remove either a portion of the substrate that was exposed to the delivered first particle beam or a portion of the substrate that was not exposed to the delivered first particle beam. In one example, the angle may be greater than zero and less than 180 degrees.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A are schematic plan view of a structure formed on a surface of a substrate that is positioned to receive a particle beam during a particle beam modification process, according to an embodiment described herein.

FIGS. 5B-5C are schematic side cross-sectional views of a structure formed on a surface of a substrate that is positioned to receive a particle beam during a particle beam modification process, according to an embodiment described herein.

FIG. 5D are schematic plan view of the structure, shown in FIG. 5A, after the particle beam modification process has been performed, according to an embodiment described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
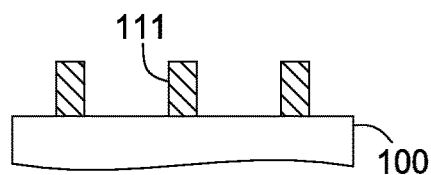
FIGS. 1A-1G illustrate a device structure during different phases of a conventional self-aligned double patterning (SADP) process.
Figure 1B:
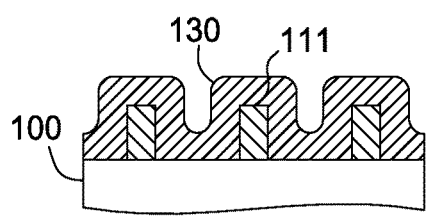

Embodiments of the disclosure provided herein include apparatus and methods for modifying a surface of a substrate using a surface modification process. The process of modifying a surface of a substrate generally includes the alteration of a physical or chemical property of the surface of the substrate and/or redistribution of a portion of an exposed material on the surface of the substrate by use of one or more energetic particle beams while the substrate is disposed within a particle beam modification apparatus. Embodiments of the disclosure may also provide a surface modification process that includes one or more pre-modification processing steps and/or one or more post-modification processing steps that are all performed within one processing system. Some embodiments of the disclosure may provide apparatus and methods for modifying a surface of a substrate by performing all of the surface modification processes within either the same processing chamber, the same processing system or within processing chambers found in two or more processing systems.

In some embodiments, the surface modification of a portion of an exposed surface of a substrate may include the use of a particle beam modification process that is performed in a sub-atmospheric pressure processing environment. In general, a particle beam modification process includes performing one or more steps that preferentially alter the physical and/or chemical properties of the material on an outer surface of a substrate. In some embodiments, the particle beam modification process is used to alter the properties of the material on select surfaces that are positioned in a desired orientation relative to the incoming particle beam. Selectively modifying the surface of the substrate or material deposited thereon enables the treated material to be removed from, or remain on, the surface of the substrate after a post-treatment process (e.g., etching process) is performed. The modification process may include implanting a particular element within selected regions on the surface of the substrate to alter the composition, chemical structure and/or physical structure (e.g., crystal structure, density, grain size, roughness, etc.) of the substrate of material deposited thereon.

Generally, the particle beam modification process includes the directional delivery of one or more energetic particle beams that include a spatially localized group of energetic particles that are directed towards a surface of a substrate for a desired period of time. The particles found in the particle beams may have approximately the same kinetic energy and are directed towards the surface of the substrate from a particle beam source to modify regions of the exposed surface of the substrate. In some cases, the particle beam modification process may include the delivery of a charged particle beam that includes a spatially localized group of electrically charged particles that are directed towards a surface of a substrate. The process may be performed on various materials such as conductive materials, semiconducting materials and/or dielectric materials. The particle beam modification process is generally performed at a processing pressure of between about 0.01 mTorr and about 10 Torr.

Figure 2A:
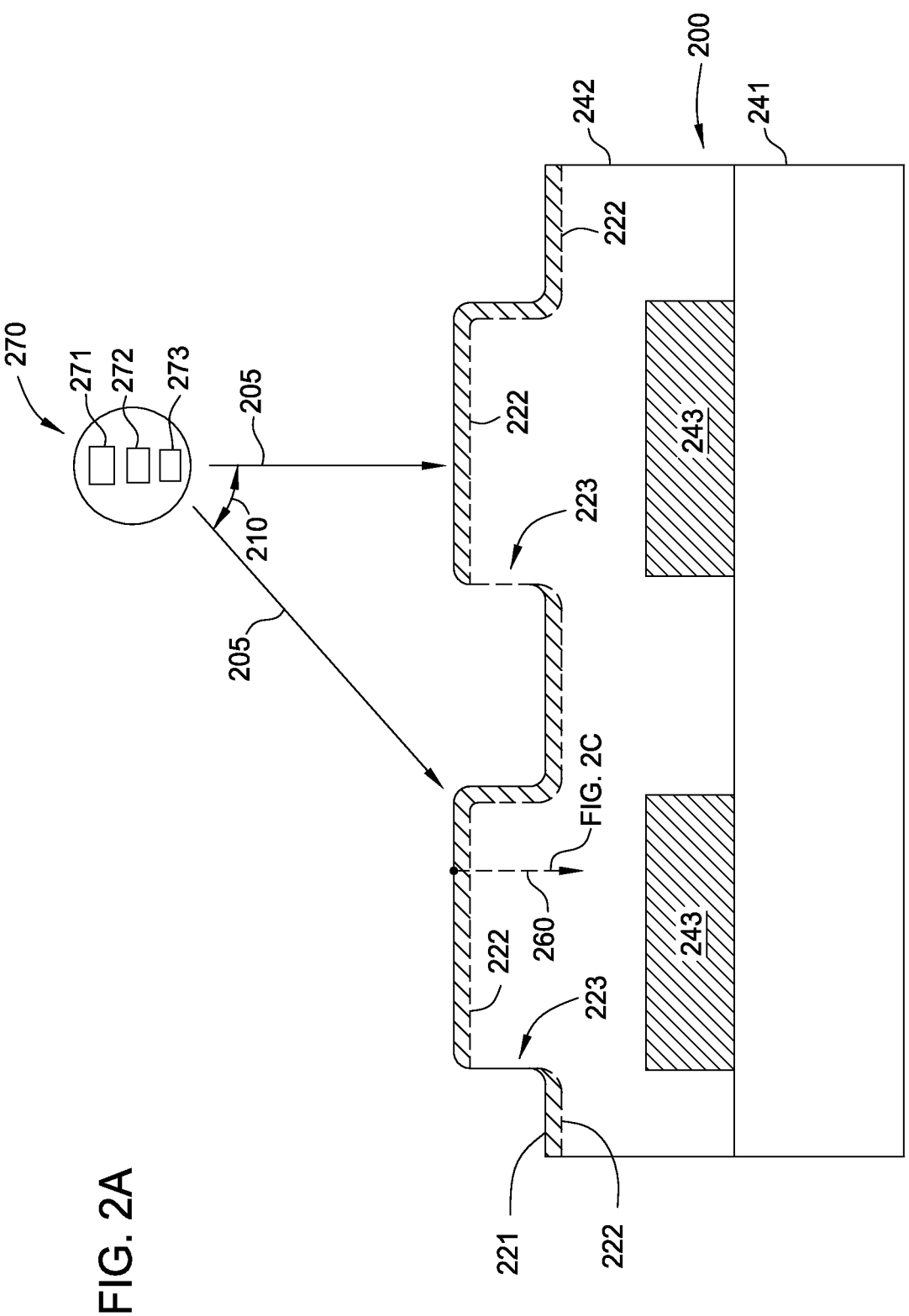
FIG. 2A is a schematic cross-sectional view of a device structure that is being processed using a particle beam modification process, according to an embodiment described herein.

FIG. 2A illustrates a schematic cross-sectional view of a device structure 200 having a non-planar surface 221 that is exposed to one or more energetic particle beams 205 to modify the non-planar surface 221 of the substrate 200. The device structure 200 may include a patterned layer 243, which is formed on a surface of the substrate 241, and a layer 242 deposited over the patterned layer 243 and the base substrate 241. Due to the absence of material in various regions of the patterned layer 243, the upper surface of the deposited layer 242 will contain features that can be partially modified by the particle beam modification process described herein to so that partially modified portions can be selective removed.

The particle beam modification process generally includes the delivery of at least one energetic particle beam 205 to the non-planar surface 221 of a substrate 200 from a particle beam source assembly 270 to modify select portions of the material on the surface of the substrate. As illustrated in FIG. 2A, the particle beams 205 are configured to treat/modify the regions 222 on the non-planar surface 221 of the substrate 200.

During the particle beam modification process, by controlling the directional nature of each of the delivered particle beams 205 and the orientation of the surface of the substrate to the delivered particle beams 205, certain regions of the substrate will be modified, such as the modified regions 222, and other regions of the substrate may remain unmodified, such as unmodified regions 223. Therefore, due to the directional nature of the particle beam modification process, depending on the type of modification process and its affect on the material in the regions 222, the modified regions on the substrate surface may be selectively removed during a subsequent post-treatment process step. The post-treatment process may be completed during a portion of the particle modification process or as a separate process step. Processes where the modified regions are removed from the surface of the substrate during the post-treatment process are typically called a "negative" type surface modification process and processes where the modified regions are altered so that they remain on the surface of the substrate after the post-treatment process has been performed are typically called a "positive" type surface modification process.

The particle beam source assembly 270, as illustrated in FIG. 2A, typically includes a gas source 271, a plasma generation source 272 and an electrode assembly 273. The gas source 271 generally includes one or more sources of gas atoms, gas phase molecules or other vapor delivering sources that are able to provide a process gas that includes gas atoms, molecules, or vapor that when ionized by the plasma generation source 272 can be extracted by the electrode assembly 273 to form at least part, if not all of, the particle beam 205.

The plasma generation source 272 generally includes a source of electromagnetic energy that is configured to deliver energy to a plasma generation region to form a plasma therein using the process gas delivered from the gas source 271. In general, the plasma generation source 272 can use one or more plasma generation techniques to form a plasma in the plasma generation region. The plasma generation techniques may include, for example, the delivery of electromagnetic energy to the plasma generation region from a capacitively coupled plasma source, an inductive coupled plasma source, a helicon type source, electron cyclotron resonance (ECR) type source and/or the delivery of microwave energy from a microwave source.

The electrode assembly 273 is generally a device that is used to extract ions generated within the plasma generation region of the plasma generation source 272 to form and deliver one or more energetic particle beams that each include a spatially localized group of energetic particles that are directed towards a surface of a substrate. The one or more energetic particle beams 205 may include a cylindrical shaped beam, a plurality of adjacent or overlapping cylindrical beams, or a ribbon shaped beam (e.g., a rectangular shaped beam). The one or more energetic particle beams 205 can be moved relative to the non-planar surface 221 and/or the substrate can be moved relative to the energetic particle beams 205 during processing to modify the surface of the substrate. In some embodiments, the electrode assembly 273 includes components that are adapted to adjust the trajectory (e.g., angle 210) of the generated energetic particle beams to the surface of the substrate to compensate for surface morphology variations on the non-planar surface 221 and/or improve the results of the particle beam modification process.

Figure 2B:
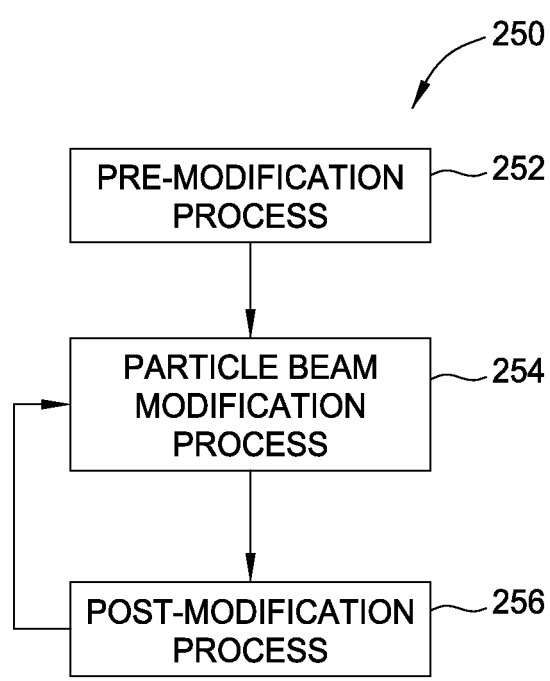
FIG. 2B one or more method steps that can be used to perform a surface modification process, according to an embodiment described herein.

FIG. 2B illustrates one example of a surface modification processing sequence 250. The processing sequence 250 generally includes an optional pre-modification process 252, a particle beam modification process 254 and a post-modification process 256. In some configurations the particle beam modification process 254 and a post-modification process 256 may be performed concurrently. Additionally steps may be added in between any of the steps depicted in FIG. 2B as needed to improve the surface modification process results.

The processing sequence 250, starts at process 252 in which an optional pre-modification process is performed on a surface of a substrate. The optional pre-modification process 252 may include the use of a wet or dry chemical cleaning process that is used to prepare and/or clean a portion of the surface of the substrate. In one example, an oxide layer or a contaminated layer may be removed from the surface of the substrate by use of one or more reactive species, such as delivering an etching gas or a cleaning solution to a surface of the substrate, to remove a portion of the material from the surface of the substrate. In some case, the pre-modification process 252 may include exposing the surfaces of the substrate to a halogen containing plasma for a period of time, a thermal degassing process, a non-selective non-reactive etching process of the surface or other similar process.

Next, a particle beam modification process 254 is performed on an exposed surface of a substrate to modify a region on the surface of the substrate. Particle beam modification process 254 generally includes the delivery of an energetic particle beam directed towards a surface of a substrate for a desired period of time. The particle beam modification process may include the simultaneous and/or sequential delivery of a plurality of particle beams 205 to a surface of the substrate. Each of the delivered particle beams may have different processing characteristics, such as beam energy, beam angle, beam composition (e.g., gas ions), or other useful property. In some embodiments, the particle beam modification process step includes the delivery of at least one energetic particle beam to a surface of a substrate in multiple sequential processing steps to modify the surface of the substrate. The particle beam modification process 254 may also include the use of physical and/or chemical material modification processes performed in a single process step or in one or more of the multiple sequential processing steps.

The physical component of particle beam modification process generally includes the energetic bombardment of a portion of the surface of the substrate, whereby the energetic particles in the particle beam 205, cause the physical and/or chemical properties of the material in the modified regions 222 of the substrate to be changed by the exposure to the particle beam. By controlling the particle beam parameters (e.g., energy, angle, etc.) and time that the surface of the substrate is exposed to the particle beam 205, a desired modified material profile can be achieved within the surface of the substrate. The desired modified material profile is generally the relative change in the properties of the material as a function of depth within the substrate. The attributes of the modified material profile created during the particle beam modification process will be discussed further below in conjunction with FIG. 6.

Typically, the higher the mass of the atoms and/or molecules that form the energetic particles in the particle beam 205, the greater the ability of the particle beam 205 to physically alter the material in the modified regions 222 on the surface of the substrate. In some embodiments, the particle beam comprises energetic ions and/or neutrals formed from a plasma that contains one or more gas atoms, such as argon (Ar), neon (Ne), krypton (Kr), xenon (Xe), radon (Rn), nitrogen (N), helium (He) and hydrogen (H), and/or molecules, such as nitrogen and hydrogen compounds ($N_xH_y$), or a combination of thereof (e.g., Ar/Xe). In one example, the particle beam 205 comprises argon ions.

Another factor that can affect the ability of the particle beam 205 to modify material on the surface of the substrate is the incident angle 210, which is typically measured from a direction that is perpendicular, or normal, to the surface of the substrate 200. In FIG. 2A, the particle beam $205_1$ is oriented normal to the surface of the substrate and particle beam $205_2$ is shown at an angle 210 to the surface of the substrate 200. In general, a particle beam may have an angle 210 that varies from about zero degrees (e.g., normal) and less than about 90 degrees (e.g., ~89 degrees).

In general, the chemical modification aspect of the particle beam modification process will include a gas phase or vapor phase chemical interaction of the ions or radicals found in the particle beam 205, or gas phase, vapor phase and/or gas or vapor phase reactive species (e.g., radicals) supplied from the processing environment surrounding the particle beam 205, with the material at the surface of the substrate. Thus, the chemical interaction of chemical species found in the particle beam 205, or that interact with particle beam 205, is used to help modify the material on the surface of the substrate by use of a non-physical method. In some cases, the chemical material modification process may occur by reacting a gas or vapor phase chemically active species with the surface of the substrate. Therefore, in some embodiments, the particle beam 205 and/or environment surrounding the particle beam 205 comprise an chemically active gas, such as hydrogen ($H_2$), water ($H_2O$), chlorine ($Cl_2$), fluorine ($F_2$), bromine ($Br_2$) and iodine ($I_2$), and/or molecules, such as ammonia ($NH_3$). In one example, the particle beam 205 comprises chlorine (Cl) or fluorine (F) containing ions. In one example, the particle beam 205 comprises an inert gas and an etchant gas, such as a gas mixture that contains argon and fluorine or chlorine. In another example, the particle beam 205 comprises an inert gas and the processing region surrounding the substrate includes an etchant gas, such as fluorine or chlorine.

Next, a post-modification process 256 is performed on the substrate. In one example, the post-modification process 256 may include exposing the modified and unmodified regions of the substrate to a process gas, such as an etching gas, to preferentially remove at least a portion of the modified or unmodified material disposed on the surface of the substrate. The post-modification process removes and/or further modifies the exposed regions on the surface of the substrate. The plasma modification process 254 may provide a rapid and/or partial modification of the surface of the substrate, and the post-modification process 256 may provide the final modifying process performed on the surface of the substrate. The particle beam modification process may improve the etch selectivity of the modified regions 222 versus the unmodified regions 223, so that the modified regions 222 are preferentially remove during the post-modification process (e.g., negative modification process) in some applications. Alternately, the particle beam modification process may be used to modify the material in the regions 222 so that the post-modification process can be used to selectively remove the un-modified regions 223 of the substrate versus the modified regions 222 (e.g., positive modification process).

In some embodiments, the post-modification process includes exposing the surface of the substrate to process gases that contain radicals, ions or neutrals. In some embodiments, the process gas(es) may include a halogen (e.g., fluorine, fluorine compounds, chlorine, chlorine compounds, bromine, bromine compounds), ammonia containing compounds, or other useful gases or molecules. In some embodiments, the post-modification process may include delivering a gas or vapor phase etchant to the surface of the substrate. The environment surrounding the substrate during the post-modification process may comprise an etchant material, such as an etchant gas that contains a halogen gas, such as chlorine ($Cl_2$), fluorine ($F_2$), bromine ($Br_2$) and iodine ($I_2$), and/or molecules, such as ammonia ($NH_3$). In one example, the particle beam 205 comprises chlorine (Cl) or fluorine (F) containing ions and the environment surrounding the substrate may comprise an etchant gas, such as a gas mixture that contains fluorine or chlorine. In another example, the post-modification process gas comprises an etchant gas, where the etchant gas may contain fluorine ($F_2$), nitrogen trifluoride ($NF_3$), carbon tetrafluoride ($CF_4$), boron trifluoride ($BF_3$), xenon difluoride ($XeF_2$), boron trichloride ($BCl_2$), trifluoromethane ($CHF_3$), hexafluoroethane ($C_2F_6$), chlorine ($Cl_2$) or other fluorocarbons or chlorine containing gases.

In one embodiment, the post-modification process is a remote plasma assisted dry etching type process which includes the simultaneous exposure of a substrate to $NF_3$ and $NH_3$ plasma by-products. In one example, the plasma etch process may be similar to or may include a SiCoNi® etch process that is available from Applied Materials, Inc. of Santa Clara, Calif. In some embodiments, the post-modification process 256 includes the use of a remote plasma excitation source that provides energy to the process gases so that the excited gas species do not damage the substrate during processing. The remote plasma etch can be largely selective towards the modified regions 222 or unmodified regions 223 formed during the process 254. The remote plasma process may produce solid by-products which grow on the surface of the substrate as substrate material is removed, which may then be subsequently removed via sublimation when the temperature of the substrate is raised.

The post-modification process may be performed at a pressure of about 5 Torr, and an RF power setting of about 30 W may be utilized to ionize a mixture of $NF_3$ and the $NH_3$ that is then delivered to the surface of the substrate. By-products may then be sublimated from the surface of the substrate by annealing the substrate at a temperature of about 120° C. or more for about 5 seconds to about 100 seconds, such as about 60 seconds. Other embodiments of fluorine based cleaning involve, reacting $NH_3$ gas and $F_2$ or anhydrous HF gas in either plasma or thermal heat.

In some embodiment of the process sequence 250, the particle beam modification process 254 and post-modifications process 256 are repeated at least twice to achieve a desired amount of treated material which is to be removed from the surface of the substrate. In some process sequences, the processing characteristics for the particle beam modification processes 254 are exactly the same each time it is repetitively performed. In other process sequences, the at least one process variable (e.g., particle beam energy, angle, chemistry of the environment surrounding substrate, etc.) for the particle beam modification processes 254 is different from a previously performed particle beam modification process 254 process step.

Hardware Configurations

Figures 3, 4:
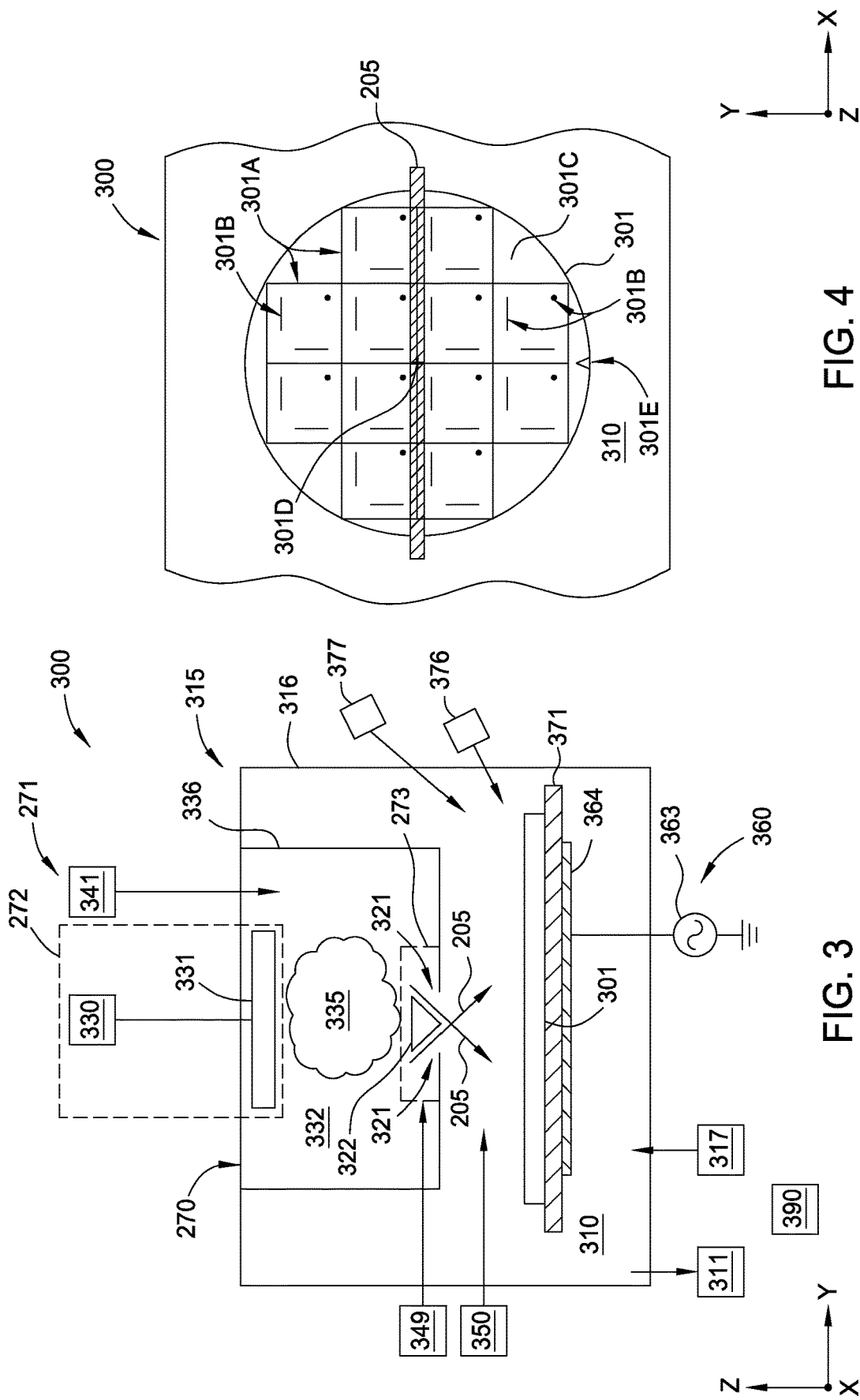
FIG. 3 is a schematic side view of a portion of a processing chamber that includes a particle beam generating assembly, according to an embodiment described herein.
FIG. 4 is a schematic plan view of substrate that is receiving at least a portion of a particle beam generated from a particle beam modification apparatus, according to an embodiment described herein.

FIG. 3 is a schematic cross-sectional view of a processing chamber 300 that may be adapted to perform a plasma modification process. The processing chamber 300 includes a particle beam source assembly 270 that is positioned to modify a portion of a substrate 301. The processing chamber 300 generally includes a chamber assembly 315 and the particle beam source assembly 270. The chamber assembly 315 generally includes one or more walls 316 that enclose the processing region 310 in which the substrate 301 is disposed during the particle beam modification process. The chamber assembly 315 will also typically include a system controller 390, a pumping system 311 and a gas delivery source 317, which are used in combination to control the processing environment within the processing region 310. The pumping system 311 may include one or more mechanical pumps (e.g., rough pump, turbo pump) that are configured to control a desired pressure within the processing region 310. The gas delivery source 317 may include one or more sources that are configured to deliver an amount or a flow of an inert and/or a reactive gas (e.g., etchant gases) to the processing region 310. In some configurations, the chamber assembly 315 may also include a thermal source (not shown), e.g., lamps, radiant heaters, that is controlled by the system controller 390 to adjust the temperature of the substrate 301 during processing. In one example, the system controller 390 is configured to control the gas composition, chamber pressure, substrate temperature, gas flow or other useful process parameter in the processing region 310 during the particle beam modification process.

The chamber assembly 315 will also typically include a substrate support assembly 371 that is adapted to support the substrate during processing. The substrate support assembly 371 may include one or more actuators (not shown) that are adapted to translate or rotate the substrate relative to the electrode assembly 273 during processing. In some cases, the substrate may be rotated about its central axis 301D. In applications that require the substrate 301 to be translated or rotated, some of the driving components, such as an actuator or a motor are positioned outside of the processing region 310 and are coupled to the elements that support the substrate 301 within the processing region 310 using a conventional vacuum feed-through or other similar mechanical device. In some configurations, one or more of the actuators are adapted to position the substrate 301 relative to the electrode assembly 273 so that a desired gap (not shown), which is measured in the Z-direction in FIG. 3, is formed between the substrate 301 and the electrode assembly 273.

As noted above, the particle beam source assembly 270 typically includes a gas source 271, a plasma generation source 272 and electrode assembly 273. In one configuration, as illustrated in FIG. 3, the gas source 271 generally includes one or more separate gas sources 341 that are each configured to deliver a process gas (e.g., gas atoms, gas phase molecules or other vapor containing materials) to the plasma generation region 332 of the particle beam source assembly 270. The plasma generation region 332 may be bounded by walls 336. In one example, a gas source 341 is configured to deliver a process gas that includes a gas selected from the group consisting of argon (Ar), neon (Ne), krypton (Kr), xenon (Xe), radon (Rn), nitrogen (N), helium (He), hydrogen (H), chlorine ($Cl_2$), fluorine ($F_2$), bromine ($Br_2$), iodine ($I_2$), ammonia ($NH_3$) and/or combinations thereof to the plasma generation region 332.

Referring to FIG. 3, the pumping system 311 may also be separately connected to the processing region 310 and the plasma generation region 332 so that different pressures can be maintained in each region. In one example, the pumping system 311, gas delivery source 317 and/or gas sources 341 are configured to work together to maintain the plasma generation region 332 at a pressure greater than the processing region 310 during processing. In one configuration, the plasma generation region 332 includes a pump (not shown) that is separate from the pumping system 311, and is configured to maintain the pressure in the plasma generation region 332 at a desired level.

The plasma generation source 272 generally includes a source of electromagnetic energy that is configured to form a plasma 335 in the plasma generation region 332 using the process gas delivered from the one or more gas sources 341. The plasma generation source 272 may include a power source 330 and an antenna 331, which is in electrical communication with the plasma generation region 332. In one non-limiting example, the antenna 331 may be a capacitively coupled electrode that is adapted to generate the plasma 335 in the plasma generation region 332, when radio frequency (RF) energy is delivered from the power source 330 to the antenna 331 during processing.

The electrode assembly 273 may include a beam controller 349 and beam delivery element 322 that are used to extract ions formed within the plasma generation region 332 to form and deliver one or more energetic particle beams 205 to a surface of a substrate 301 through one or more apertures 321 that are formed in the beam delivery element 322. The shape of the aperture 321 is formed so that a beam having a desired shape is created by the beam delivery element 322, such as a ribbon shaped or cylindrical shaped beam. In some configurations, the aperture 321 is also positioned and aligned to direct the particle beam 205 to a desired portion or region of the surface of the substrate during processing. The system controller 390 is generally configured to control the generation and delivery of the one or more energetic particle beams 205 by sending commands to the various components found in the beam controller 349 and beam delivery element 322. The beam delivery element 322, which is coupled to the beam controller 349, may include a "triode" assembly that is configured to extract ions generated in the plasma generation region 332 of the plasma generation source 272 and form and deliver an energetic particle beam 205 to desired region of a surface of a substrate 301 through an aperture 321 formed in the beam delivery element 322. In operation, a triode assembly will contain a first electrode, a second electrodes, and a third electrode that are independently biased, such that the properties of the particle beam 205, such as particle beam energy (e.g., kinetic energy) and direction, can be controlled. Since it may be possible to form positive or negative ions in the plasma 335 the biases applied to the various electrodes may be adjusted accordingly to generate and deliver a particle beam 205 having a desired composition and energy to the surface of the substrate 301. In some embodiments, the particles (e.g., charged particles or neutrals) in the particle beam 205 are delivered to the surface of the substrate at an energy of, for example, approximately 0.1 keV to 20 keV.

The chamber assembly 315 may include a bias assembly 360 that is in communication with the system controller 390 and is configured to deliver energy to the processing region 310 of the processing chamber 300. The bias assembly 360 generally includes a support electrode 364 and a source 363, which is coupled to ground and can be used to remove any accumulated charge found on the substrate 301 during or after performing the plasma modification process. To remove any residual charge found on the substrate, the source 363 may utilize an AC or high frequency power source (e.g., 2 MHz-200 MHz power source) that is configured to form a plasma over the substrate 301 during one or more phases of the plasma modification process performed in the processing region 310. It is believed that the formed plasma will provide a path to ground that will allow any stored charge in the substrate to be dissipated. In some cases the bias assembly 360 can also be used to help control the trajectory and/or energy of the particle beam 205 that strikes the surface of the substrate 301 during the plasma modification process 254.

In some embodiments, the chamber 301 may also include a reactant source 350 that is configured to deliver a reactant gas to the region of the surface of the substrate that is to receive, or is receiving, the generated particle beam 205. In one configuration, the reactant source is a remote plasma source (RPS) that is configured to provide an ion, a radical and/or a neutral containing gas to the surface of the substrate to promote the modification and/or removal of a portion of the material from the surface of the substrate. The RPS may include a capacitively coupled, inductively coupled or microwave type source that is adapted to generate ions or radicals within a process gas that is delivered through a portion of the RPS assembly from a gas source. In some cases, the reactant source 350 may provide at least one of the post-processing process gases to the surface of the substrate so that the processes 254 and 256 can be performed simultaneously. In some cases, the reactant gas is provide to the region of the substrate to enhance the particle beam modification process 254, so that the subsequent post-modification process 256 is more rapidly performed.

FIG. 4 is a plan view of the substrate 301 that is disposed within the processing region 310 of the processing chamber 300. The substrate 301, may include a plurality of die 301A that contain a plurality of features 301B formed therein. Typically the plurality of die 301A are aligned relative to an alignment mark and notch 301E of the substrate 301. The features 301B will generally include protrusions and depressions in the non-planar surface 301C of the substrate 301, which are to be selectively modified using the processes described herein. The features 301B may be similar to the features discussed above in conjunction with FIG. 2A, and are only provided as examples of features that may be modified using processes described herein.

In some embodiments of the processing chamber 300, a substrate inspection module 377 (FIG. 3) is used to inspect and orient the substrate 301, and thus features 301B, relative to the particle beam source assembly 270, so that the particle beam can be directed to modify only the features 301B that are desirably oriented on the substrate. In general, the inspection and alignment device may include a camera (not shown (e.g., CCD camera)) and one or more actuators (not shown), such as an X-Y stage with a rotational actuator (about Z-direction). The camera and the one or more actuators are in communication with the system controller 390, so that the system controller 390 can provide instructions to various components in the system to reorient and/or reposition (e.g., angular and/or X-Y position (FIG. 4)) the substrate based on the data received by the camera and the control of the one or more actuators. The one or more actuators can be coupled to the substrate supporting elements, such as the substrate support assembly 371. The inspection module 377 can also be configured to determine an orientation of a substrate and provide information relating to the determined orientation to the system controller, so that the system controller can cause the substrate transferring components (e.g., robots, X-Y stages) to position the substrate on the substrate supporting surface in the processing chamber in a desired orientation relative to the relative movement of the substrate during processing, or particle beam source assembly 270, based on the provided information.

In one configuration, as illustrated in FIG. 4, a single ribbon shaped particle beam 205 is oriented and delivered across the surface of the substrate 301 to modify portions of the surface 301C of the substrate 301. In some embodiments, the particle beam 205 is maintained at a desired preferred angle relative to surface of the substrate to assure that the layout, orientation or directional nature of plurality of the generated particle beam(s) 205 can be used to modify certain features that are aligned in a certain direction relative to the substrate surface, such as discussed in conjunction with FIGS. 5A-5D below. In one example, as illustrated in FIGS. 4 and 5B, the particle beam source assembly 270 is configured to deliver a ribbon shaped beam (e.g., particle beam 205) that is provided parallel to the X-Z plane and at a grazing angle to the normal direction (Z-direction). In this configuration, the processing chamber 300 may include a translating substrate support assembly 371 that is configured to position, support and transfer the substrate 301 relative to the particle beam 205 when the substrate 301 is disposed within the processing region 310. By varying the position of the substrate 301 relative to the particle beam 205, only regions that have a certain orientation relative to the particle beam will be modified, due to the directional nature of the incident particle beam 205. The translating substrate support assembly 371 is configured to translate the substrate in a direction that is at an angle to the direction that the particle beam(s) 205 are being delivered, so that only features that are oriented in a certain way on the surface of the substrate are modified by the delivered particle beam(s). In general, the angle between the translation direction and beam direction will be a non-zero and non-parallel angle. In some embodiments, the substrate is maintained in a fixed orientation relative the delivered particle beam 205 and/or translation direction. In one example, the translating substrate support assembly 371 is configured to translate the substrate in a direction that is substantially perpendicular to the direction that a particle beam is delivered. In this example, the translating substrate support assembly 371 may be configured to translate the substrate in the Y-direction, while a grazing angle beam that is provided in the X-Z plane (FIG. 4) is delivered to the surface of the substrate that has fixed orientation within the X-Y plane.

Referring to FIG. 2B, during processing, process 254 may thus include the following a plurality of sub-process steps. First, one or more gas sources 341 deliver one or more inert and/or reactive gases to the plasma generation region 332 surrounded by walls 336. The plasma generation source 272 then delivers an amount of electromagnetic energy to the delivered process gas to form the plasma 335 in the plasma generation region 332. The electrode assembly 273 and system controller 390 are then used to extract ions found within the plasma generation region 332 to form, control and deliver one or more energetic particle beams 205, which each have desirable particle beam properties, to a surface of a substrate 301 that is disposed on a substrate support within the processing region 310 of the process chamber 300. In some configurations of process 254, the system controller 390, pumping system 311 and gas delivery source 317 are used in combination to control the processing environment within the processing region 310. The gas delivery source 317 and pumping system 311 are typically used to control the pressure and/or gas composition of the processing environment found within the processing region 310. In some cases, the processing environment may include either an inert and/or process gas to promote the plasma modification process. During process 254, the substrate and/or the one or more energetic particle beams 205 may be moved relative to each other to enhance the plasma modification process on certain regions of the substrate. Next, after the system controller 390 receives a signal from the endpoint monitoring system 376, or by simply reaching a desired time that the substrate is exposed to the one or more energetic particle beams 205, the plasma modification process performed in process 254 is stopped.

Surface Modification Process Example

FIGS. 5A-5D illustrate an example of a device feature 501 formed on a substrate during different stages of a surface modification processing sequence. In the example described, the materials at the surface of the substrate that are modified during the particle beam modification process are materials found in the contact level or via level of a semiconductor device formed on a substrate. These materials may include conductive materials (e.g., metals) and/or dielectric materials that form portions of hard masks, interlayer dielectrics, metal containing trenches and vias, shallow trench isolation (STI) features, spacers, gate dielectrics and/or other useful materials. FIG. 5A is a plan view of a device feature 501 formed in a surface 502 of a substrate 500 prior to performing the surface modification processing sequence. In this example, the device feature 501 is a depression formed in a central region of the substrate surface 502. The device feature 501 has initial dimensions, such as an initial length 531 (FIG. 5A), an initial width 532 (FIG. 5A) and an initial depth 533 (FIG. 5B). The feature 501 also includes first side walls 511, second side walls 512, 513 and base surface 514, wherein the first side walls 511 are at an angle to the second side walls 512, 513 (e.g., orthogonal to each other).

Next, in this example, after optionally performing pre-modification process 252 on the substrate 500, the particle beam modification process (process 254) is performed on the substrate. FIGS. 5B and 5C are side cross-sectional views of different portions of the device feature 501 as taken along section lines 5B-5B and 5C-5C while the particle modification process is performed on the device feature 501. As illustrated in FIG. 5B, the directional nature of particle beam 205 (i.e., provided in the −X-direction), modifies selected exposed regions of the surface 502 of the substrate 500 to form modified regions 522. In this example, the particle beam 205 is a ribbon beam that is delivered across the surface of the substrate, wherein the delivered particles in the particle beam 205 are directed in the −X-direction and are within the X-Z plane. As shown in FIG. 5B, the field surface region 502A, left side wall 512A and base surface 514 are modified by the delivery of the particle beam 205 and the right side wall 512B remains unmodified. As illustrated in FIG. 5C, due to the directional nature of particle beam 205 (i.e., provided in the −X-direction), only the field surface region 502A and the base surface 514 are modified by the delivery of the particle beam 205 and the side walls 511 remain unmodified. After completing process 254, the original device feature 501 now contains modified attributes, as illustrated by modified regions 522 in FIGS. 5B and 5C.

Next, after completing process 254, the post-process 256 is performed on the substrate to remove the modified regions 222 from the substrate. In this case, the post-process 256 includes exposing the substrate to a dry etching process sequence to remove the modified regions 222. Referring to FIG. 5D, which is a plan view of the modified device feature 501A formed in a surface 502 of a substrate 500. In this example, the original device feature 501, which had an initial length 531, initial width 532 and initial depth 533, has been altered so that the modified device feature 501A now has a final length 534, but the initial width 532 and the initial depth 533 will remain unchanged. It is assumed that the modified regions 522 formed on the field surface region(s) 502A and base surface 514 will be removed at the same rate so that the initial depth 533 remains unchanged after performing processes 252-256. Thus, due to the directional nature of the particle beam, the surface modification process selectively lengthens the original device feature 501 in the −X direction by an amount equal to the final width 534 minus the initial width 531, which in some cases is equal to the thickness of the modified region 522 formed on the left wall 512A.

Figure 1C:
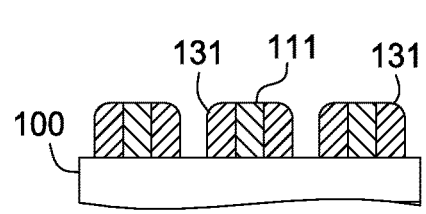
Figure 1D:
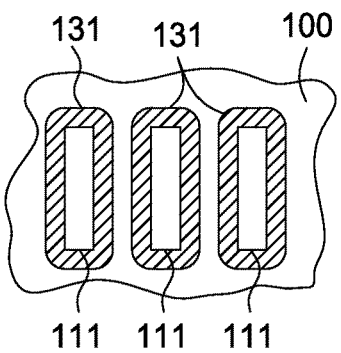
Figure 1E:
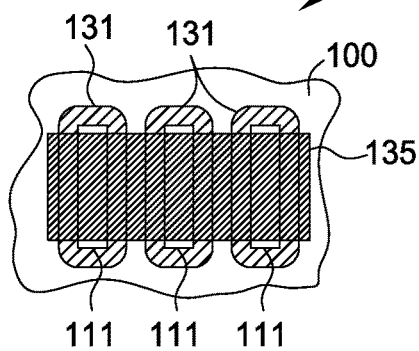
Figure 1F:
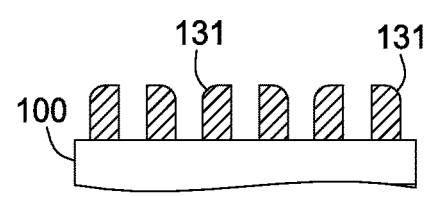
Figure 1G:
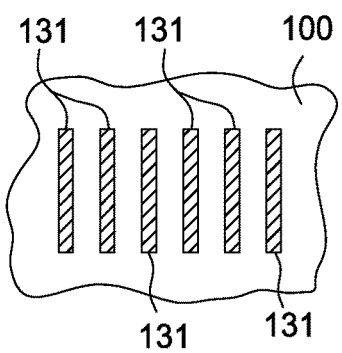

While FIGS. 5A-5D illustrate a device feature 501 that is a formed within a surface of substrate, this configuration is not intended to be limiting as to the scope of the disclosure provided herein, since features that protrude from the surface of the substrate (e.g., items 111 and 131 in FIGS. 1C and 1D) may also be desirably processed using the techniques disclosed herein.

Figure 6:
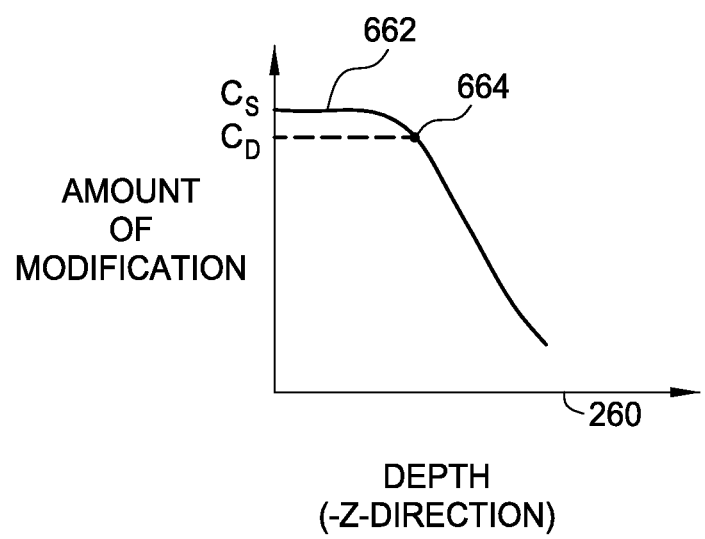
FIG. 6 is a plot of a particle beam modification profile as a function of depth in a surface of the substrate, according to an embodiment described herein.

FIG. 6 is a plot of a modified material profile 662 plotted along an axis 260 (FIG. 2A) extending into a surface of a substrate 200. The modified material profile is a graphical representation of the amount of modification applied to the surface of the substrate found in the modified region 222 as a function of depth. By controlling the particle beam parameters and time that the surface of the substrate is exposed to the particle beam 205, a desired modified material profile can be achieved within the surface of the substrate. In one example, where the particle beam modification process is adjusted to implant an element or molecule into the surface of the substrate, the modified material profile represents the concentration of the implanted element as a function of depth (e.g., atoms/cm$^3$ measured along the axis 260). Thus, in some cases, where the surface of the substrate comprises silicon (Si), doped silicon (e.g., n-type or p-type), silicon oxide (SiO$_x$), silicon nitride (SiN) or other useful silicon compound, the implanted element may include hydrogen ($H_x$ or $H_x^+$) or dopant atoms (e.g., boron (B), gallium (Ga), phosphorous (P), arsenic (As), etc.) that preferentially alter the surface of the substrate. Alternatively, in one example, the particle beam modification process is adjusted to primarily alter the physical structure of the material at the surface of the substrate (e.g., amorphize, alter crystal structure), by directing the particle beam containing a gas or molecule to the surface of the substrate, and thus the modified material profile illustrated in FIG. 6 represents the concentration of the altered physical structure as a function of depth (e.g., thickness of amorphous region, defects/cm$^3$, dislocations/cm$^3$, etc. measured along the axis 260). Thus, in some cases, the particle beam 205 may include an inert gas, such as argon (Ar), neon (Ne), krypton (Kr), xenon (Xe), radon (Rn), nitrogen (N), helium (He) or a combination thereof.

The modified material profile 662 in general will have a surface concentration $C_S$ and a critical dose concentration $C_D$, where concentration levels of the modified parameter (e.g., concentration of the implanted element, concentration of defects, etc.) that are equal to or greater than the critical dose $C_D$, which defines the depth of the modified region 222. In general, if a negative modification process is used, the critical dose $C_D$ will define the depth of the material that will be removed during the post-modification process step. Thus, concentration levels of the modified parameter that are less than the critical dose $C_D$ will tend to be more slowly removed during the post-modification process 256 than concentration levels above the critical dose $C_D$. Therefore, it is desirable for the slope of the modified material profile as a function of depth to be steep after the critical dose ($C_D$) level 664 has been reached. In general, the critical dose $C_D$ amount at the critical dose level 664 will vary depending on the properties of the material that has received the particle beam modification process and the attributes of the post-modification process, such as, for example, the types of chemicals used during the post-modification process, process time, process temperature, plasma power (if used) and concentration of the processing chemistry used during the post-modification process.

Referring back to FIG. 5B, to allow the modification of all of the surfaces within a plane, and thus possibly avoiding the shadowing effect of the right edge of the feature 501 from preventing the side wall 512B from being modified, it may be desirable to provide multiple particle beams that are delivered in different directions during the particle beam modification process 254. In one example, as illustrated in FIG. 7A, a particle beam source assembly 270 may be configured to deliver at least two particle beams 205 that are delivered in different directions, such as opposing directions (i.e., −X and +X-directions). As illustrated in FIG. 7B, the particle beam source assembly 270 may be configured to deliver two beams 205 in a bi-modal distribution, where the distribution of the energetic particles provided in each of the particle beams 205 (i.e., beam intensity $I_1$ and $I_2$) is directed at a preferred angle, such as angle $A_1$ for the +X-direction particle beam 205 and angle $A_2$ for the −X-direction particle beam 205. Thus, if an opposing direction particle beam configuration had been used in the process example shown in FIGS. 5A-5D, where the opposing beams are delivered in the same plane or in parallel planes, both opposing side wall features 512A and 512B (FIG. 5B) can be modified, while the side walls 511 (FIG. 5C) would still remain unmodified. In this case, both X-direction dimensions of the feature 501 in FIG. 5A can be altered, versus only the −X direction dimension, as discussed above.

Figure 7C:
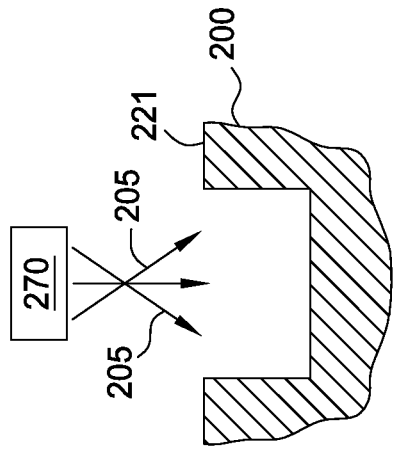
FIG. 7C is a schematic side cross-sectional view of a particle beam modification apparatus that is adapted to provide multiple particle beams, according to an embodiment described herein.
Figure 7D:
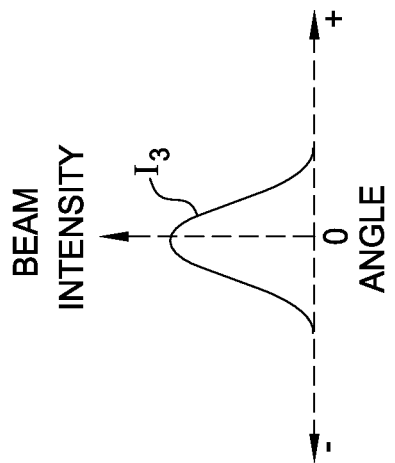
FIG. 7D is a plot of the particle beam distribution as a function of angle for the particle beams delivered from the particle beam source assembly illustrated in FIG. 7C, according to an embodiment described herein.
Figure 7A:
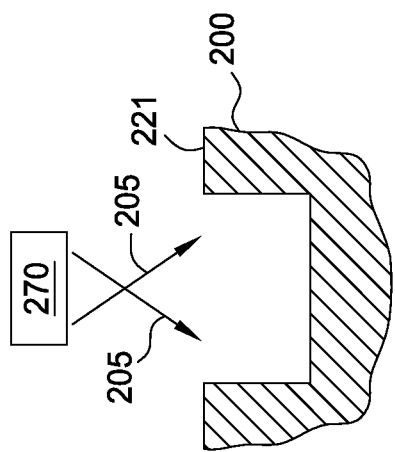
FIG. 7A is a schematic side cross-sectional view of a particle beam modification apparatus that is adapted to provide multiple particle beams, according to an embodiment described herein.
Figure 7B:
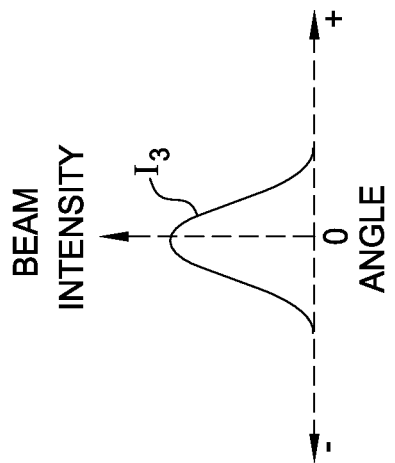
FIG. 7B is a plot of the particle beam distribution as a function of angle for the particle beams delivered from the particle beam source assembly illustrated in FIG. 7A, according to an embodiment described herein.

In another configuration illustrated in FIG. 7C, a particle beam source assembly 270 may be configured to deliver at least three particle beams 205 that are each delivered in different directions. As shown, three particle beams 205 are delivered in the −X-direction, +X-direction and normal direction. As illustrated in FIG. 7D, the intensity of the sum of the effects of the multiple particle beams provided by the particle beam source assembly 270 is configured to deliver a broader particle beam energy distribution, where the distribution of the energetic particles provided from the particle beams 205 has an averaged shape as shown by the beam intensity $I_3$. By varying the energy provided by the different particle beams, the shape of the distribution can be altered to improve some aspect of the particle beam modification process.

Process Chamber and System Examples

Figure 8:
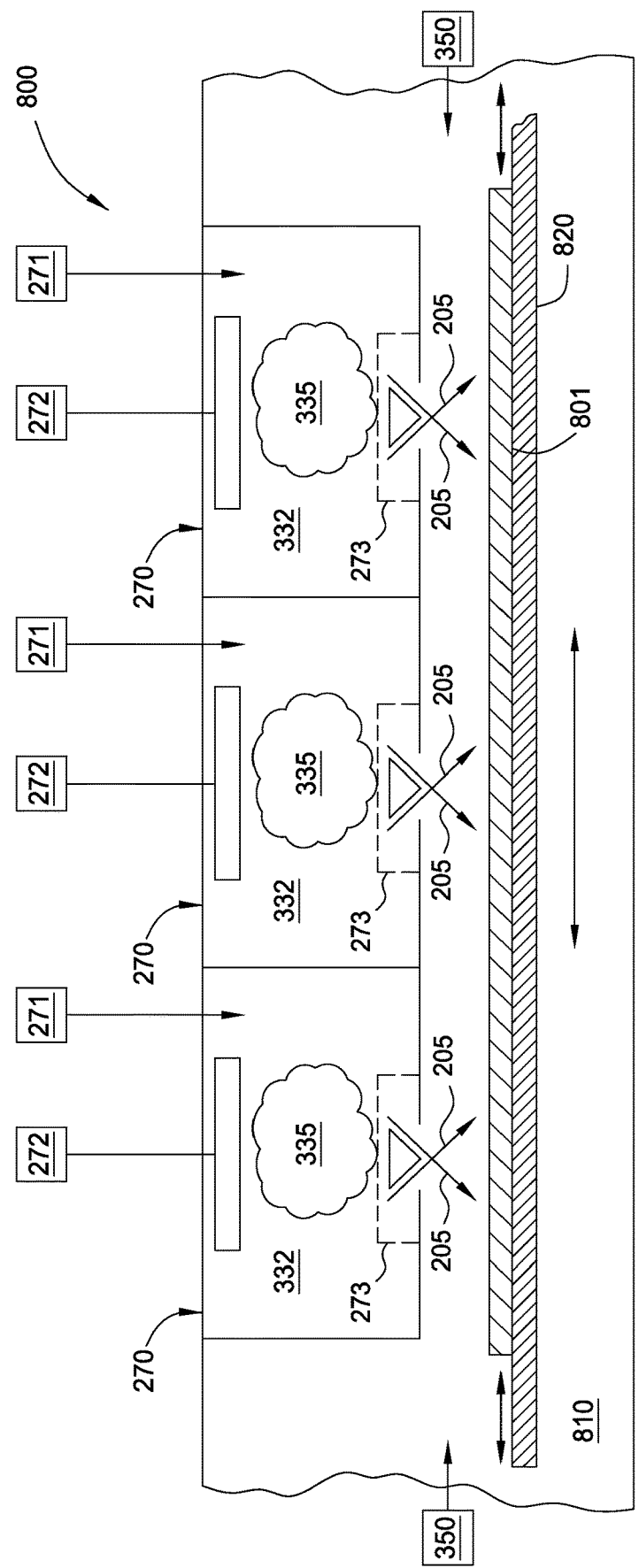
FIG. 8 is a side view of a processing chamber that is configured to process a substrate, according to an embodiment described herein.

FIG. 8 is a side view of a processing chamber 800 that may be used to perform one or more substrate processing steps in accordance with one embodiment of the present disclosure. The processing chamber 800 includes a plurality of particle beam source assemblies 270 (three are shown) that are each configured to deliver one or more particle beams 205 to a surface of a substrate 801. The particle beam source assemblies 270 are configured to deliver one or more particle beams 205 to a surface of the substrate 301 as the substrate is moved relative to the particle beam source assemblies 270 by use of an actuator 820, such as a linear actuator configured to move the substrate 801 relative to the particle beam source assemblies 270. In some configurations, the actuator 820 is adapted to move the substrate 801 in a back-and-forth motion (e.g., +X and −X directions) relative to the particle beam source assemblies 270. The substrate may be maintained at a fixed orientation relative to the orientation of the provided particle beams 205 along one or more axes (e.g., Y and Z axes) and be moved relative to the particle beams along another axis (e.g., X-axis). Prior to or during the particle beam modification process 254, it may be desirable to detect the alignment of the features formed the surface of the substrate and to align the substrate relative to the particle beam source assemblies 270 using hardware components found in the processing chamber 800, such as the actuator 820.

As similarly discussed above, each of the particle beam source assemblies 270 within the processing chamber 800 may be configured to provide the same type of particle beam 205 to the surface of the substrate as the substrate 801 is moved relative to the particle beam source assemblies 270 by use of an actuator 820. In another configuration, two or more of the particle beam source assemblies 270 are adapted to provide at least one particle beam 205 that has some different processing characteristic, such as beam energy, beam angle (e.g., angle 210 in FIG. 2A), beam angle relative to the transfer direction of the substrate, beam composition (e.g., gas ions), or other useful property to the surface of the substrate. In some cases, it may be desirable to provide a higher energy particle beam 205 to the surface of the substrate by a first particle beam source assembly 270 and then a less aggressive modification process is performed by the second and/or third particle beam source assemblies 270.

Figure 9:
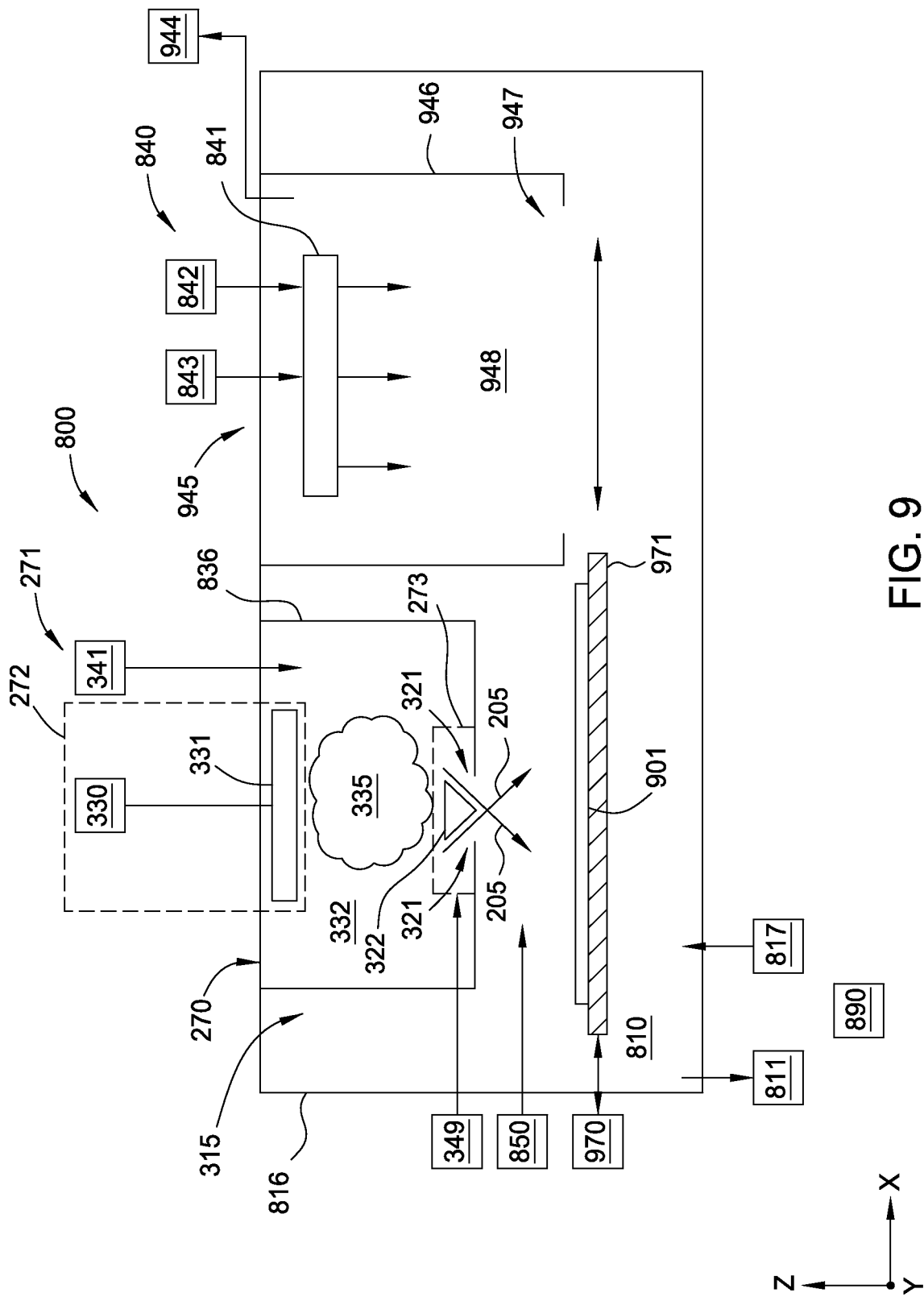
FIG. 9 is a side view of a processing chamber that is configured to process a substrate, according to an embodiment described herein.

FIG. 9 is a side view of a processing chamber 800 that may be used to perform multiple processing steps of processing sequence 250 in accordance with one embodiment of the present disclosure. The processing chamber 800 defines a processing region 810 at least partially defined by walls 816. In one example, the processing chamber 800 may be adapted to perform at least part of the plasma modification process 254 and post-process 256. The processing chamber 800 generally includes a chamber assembly 315 configured to deliver one or more particle beams 205 to a surface of a substrate 901 and post-modification assembly 840. The plasma generation region 332 may be bounded by walls 836. The chamber assembly 315 is configured to deliver one or more particle beams 205 to a surface of the substrate 301 as it is moved relative to the particle beam source assemblies 270 by use of an actuator 970. In one example, the actuator 970 may be a linear actuator that is configured to move the substrate 901 relative to the particle beam source assemblies 270 and post-modification assembly 840. In some configurations, the actuator 970 is adapted to move the substrate 901 in a back-and-forth motion (e.g., +X and −X directions) relative to the particle beam source assemblies 270 and post-modification assembly 840. The substrate may be maintained at a fixed orientation relative to the orientation of the provided particle beams 205 along one or more axes (e.g., Y and Z axes) and be moved relative to the particle beams along another axis (e.g., X-axis). In some embodiments, the chamber 800 may also include a reactant source 850 that is configured to deliver a reactant gas to the region of the surface of the substrate that is to receive, or is receiving, the one or more particle beams 205. In some embodiments, the processing chamber 800 may also include a system controller 890, a gas delivery source 817 and a pumping system 811 to control the processing environment with the processing region 810.

In one embodiment, the post-modification assembly 840 is configured to perform the post-modification process 256 after a particle beam modification process 254 is performed in the chamber assembly 315. The post-modification assembly 840 generally includes a source assembly 945 and walls 946 that define a sub-processing region 948 within the chamber 800. The source assembly 945 may include a gas source 843, a gas distribution element 841 that is configured to deliver a processing gas to the surface of the substrate 901 when it is disposed within the sub-processing region 948 and an optional power source 842 (e.g., RF power source) connected to the gas distribution element or other electrode or part of a remote plasma system. The optional power source 842 may be a power supply that is adapted to bias the gas distribution element 841 to form a plasma in the sub-processing region 948, or it may be a remote plasma source that is configured to deliver ions or radicals to the gas distribution element 841 and sub-processing region 948. Alternatively or additionally, the gas source 843 may be configured to deliver a process gas that contain radicals, ions and/or neutrals as discussed above in conjunction with process 256.

During processing, the sub-processing region 948 is generally defined when the substrate 901 and substrate support 971 are positioned adjacent to the opening 947 below the walls 946. In this configuration, one or more processing regimes (e.g., process 252 and/or 256) in the processing sequence 250 can be performed on the substrate 901 using the post-modification assembly 840 portion of the process chamber 800 without contaminating the processing region 810 of the processing chamber 800. In some configurations, the post-modification assembly 840 includes a pump 944 that is adapted to evacuate the sub-processing region 948 to prevent leakage of the process gases found in the sub-processing region 948 during the processing into the processing region 810.

In some embodiments, the particle beam modification process 254 and post-modification process 256 can be performed on a substrate while it is disposed in the process chamber 800. In some embodiments, the particle beam modification process 254 is performed by the chamber assembly 315 components and the post-modification process 256 is performed using the post-modification assembly 840 components. Moreover, the particle beam modification process 254 and the post-modifications process 256 sequence may be repeated at least twice within the process chamber 800 to assure that a desired amount of material is removed from the surface of the substrate. In one example, the process sequence 250 may include performing process 254, process 256, process 254, and process 256 in this order in the process chamber 800.

Cluster Tool Configuration Examples

Figure 10:
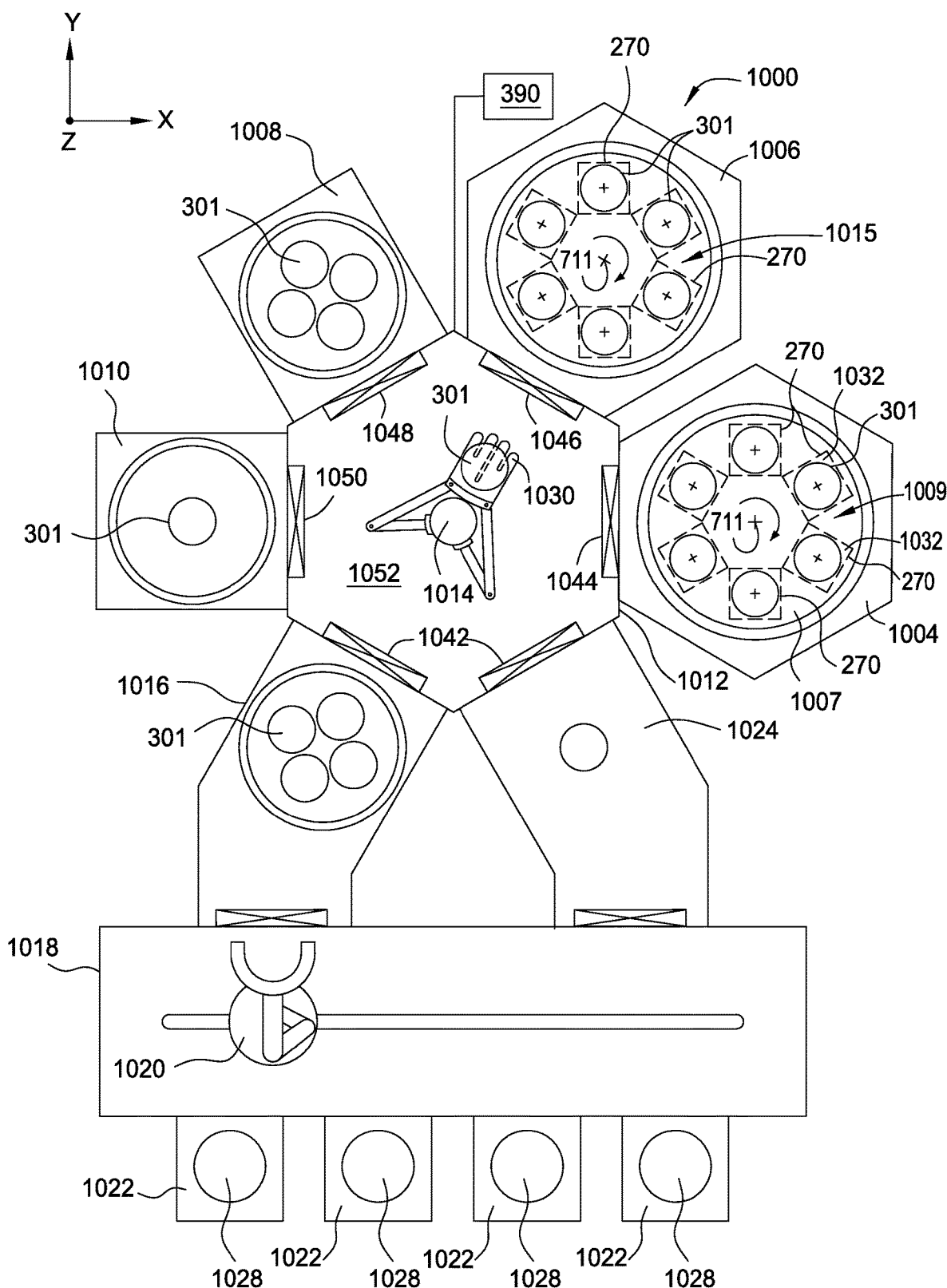
FIG. 10 is a plan view of a cluster tool including multiple-substrate processing chambers in accordance with one embodiment of the present invention.

FIG. 10 is a plan view of a processing system 1000 that may be used to perform one or more substrate processing steps in accordance with one embodiment of the present invention. One or more of the processing chambers found in the processing system 1000 are adapted to perform the plasma modification process that is described herein. The processing system 1000 generally creates a processing environment where various processes can be performed on a substrate, such as the particle beam modification process. The processing system 1000 generally include a system controller 390 programmed to carry out various processes performed in the processing system 1000.

The system controller 390 may be used to control one or more components found in the processing system. In some configurations, the system controller 390 may form part of the system controller 390, which is discussed above. The system controller 390 is generally designed to facilitate the control and automation of the processing system 1000 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and control support hardware (e.g., sensors, robots, motors, lamps, etc.), and monitor the processes performed in the system (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 390 determines which tasks are performable on a substrate in one or more of the process chambers and in the processing system 1000. Preferably, the program is software readable by the system controller 390 that includes code to perform tasks relating to monitoring, execution and control of the movement, support, and/or positioning of a substrate along with the various process recipe tasks and various chamber process recipe steps being performed in the processing system 1000.

The processing system 1000 includes a plurality of processing chambers 1004, 1006, 1008, 1010 that are coupled to a transfer chamber 1012. Each processing chamber 1004, 1006, 1008, 1010 may be configured to process one or more substrates 301 at a time. The processing chamber 1004, 1006, 1008, 1010 may have the same or different substrate processing capacities. For example, the processing chamber 1004 and 1006 can simultaneously process six substrates, while processing chambers 1008 and 1010 may be adapted to process one or more substrates at a time.

The processing system 1000 may also include load lock chambers 1016 and 1024 that are connected to the transfer chamber 1012. In one embodiment, the load lock chambers 1016 and 1024 may also be used as one or more service chambers for providing various functions for processing within the processing system 1000, for example, substrate orientation, substrate inspection, heating, cooling, degassing, or the like.

In one embodiment, the load lock chambers 1016, 1024 or the factory interface 1018, include a substrate inspection assembly (e.g., inspection module 377) that is able to detect the position and orientation of a substrate (e.g., substrate notch) relative to one or more features within the system. In some cases, the substrate inspection assembly is configured to detect the substrate's current position and orientation and then reposition and reorient the substrate so that it can then be correctly positioned and oriented in one of the processing chambers 1004, 1006, 1008, 1010 by the processing system's robotic elements. The substrate inspection assembly can thus be used to at least orient the substrate so that the particle beam modification process 254 can be desirably aligned to the features formed the surface of the substrate.

The transfer chamber 1012 defines a transfer volume 1052. A substrate transfer robot 1014 is disposed in the transfer volume 1052 for transferring substrates 301 among the processing chambers 1004, 1006, 1008, 1010, the load lock chambers 1016 or 1024. The transfer volume 1052 is in selective fluid communication with the processing chambers 1004, 1006, 1008, 1010, the load lock chambers 1016 and 1024 via slit valves 1044, 1046, 1048, 1050, 1042 respectively. In one example, the transfer volume 1052 may be maintained at a sub-atmospheric pressure while the substrates are transferred through the processing system 1000.

The processing system 1000 includes a factory interface 1018 connecting one or more pod loaders 1022 and the load lock chambers 1016 and 1024. The load lock chambers 1016 and 1024 provides a first vacuum interface between the factory interface 1018 and the transfer chamber 1012, which may be maintained in a vacuum state during processing. Each pod loader 1022 is configured to accommodate a cassette 1028 for holding and transferring a plurality of substrates. The factory interface 1018 includes a FI robot 1020 configured to shuttle substrates between the load lock chambers 1016 and 1024, and the one or more pod loaders 1022.

The substrate transfer robot 1014 includes a robot blade 1030 for carrying one or more substrates 301 among the processing chambers 1004, 1006, 1008, 1010, the load lock chamber 1016 and 1024, and loading/unloading each chamber.

Each processing chamber 1004, 1006, 1008, 1010 may be configured to perform the plasma modification process described herein. However, in one embodiment of the processing system 1000, the process chambers 1004 and 1006 are adapted to perform the plasma modification process on a plurality of substrates using a plurality of particle beam source assembly 270. The process chambers 1004 and 1006 will generally contain some or all of the process chamber hardware components discuss above in conjunction with FIGS. 1-9. In one configuration process chambers 1008 and 1010 may each be adapted to perform one or more preprocessing steps (e.g., process 252) on the substrates 301 before they are inserted into either process chamber 1004 or 1006, and/or post-modification processing steps (e.g., process 256) on the substrates 301 after they have been processed in either process chamber 1004 or 1006.

In one configuration of the processing system 1000, the processing chambers 1004 and 1006 each include a substrate conveyance assembly 1007 that is configured to retain and transport a plurality of substrates 301 that are retained within the processing regions 1009 or 1015 of the processing chambers 1004 or 1006, respectively. In one example, each of the substrate conveyance assemblies 1007 are adapted to retain six substrates 301 and rotate the substrates 301 about a central axis 711 of the processing chamber 1004 or 1006 by use of conventional rotational hardware components. The substrate conveyance assembly 1007 is thus able to transfer and position the substrates 301 relative to each of the particle beam source assemblies 270 that are positioned to process substrates 301 found in the processing region 1009 or 1015 of the processing chamber 1004 or 1006, respectively.

In some configurations of processing chamber 1004, each of the substrates 301 that are disposed on the substrate conveyance assembly 1007 can be separately moved relative to the particle beam source assembly 270 by use of a substrate actuator assembly 1032. In this case, the substrate rotation assembly 1032 generally includes an actuator (not shown) that is configured to separately directionally translate, position and/or orient a substrate supporting element (not shown), which a substrate rests on during processing, relative to the substrate conveyance assembly 1007.

However, in some embodiments, the particle beam 205 generated by each particle beam source assembly 270 may be translated relative to the surface of the substrate (e.g., X-Y plane). In this case, an actuator (not shown) that is found within each particle beam source assembly 270 is configured to translate and/or orient the beam delivery element 322 (FIG. 3) relative to the substrate to assure the complete processing of the surface of the substrate.

During a process sequence performed in processing chamber 1004, for example, the transfer robot 1014 delivers a substrate 301 to an open position on the substrate conveyance assembly 1007 and then the substrate conveyance assembly 1007 and system controller 390 work together to position the substrate 301 under one of the particle beam source assemblies 270 for processing. The transfer robot 1014 may repeat this task of sequentially loading substrates until the all of the positions in the processing chamber 1004 have been filled, and then a batch processing plasma modification processing sequence is performed on all of the substrates 301 at one time. After the substrate(s) have been sufficiently processed within the processing chamber 390 the transfer robot 1014 is then configured to remove the substrate from the process region 1009.

Alternately, in some cases, the transfer robot 1014 may insert and remove substrates from the processing chamber 1004 as needed, so that a sequentially performed plasma modification process can be performed on each substrate 301 that is serially loaded into the processing chamber 1004. In some processing configurations, the substrate conveyance assembly 1007 is configured to sequentially position the received substrates under each of the particle beam source assemblies 270 so that at least a portion of the plasma modification processing sequence is performed on the substrate by each of the particle beam source assemblies 270 before the substrate exits the process chamber. In one configuration, each of the particle beam source assemblies 270 within the processing chamber 390 are configured to separately provide the same type of particle beam 205 to the surface of the substrate during the sequential process. In another configuration, two or more of the particle beam source assemblies 270 are each adapted to separately provide a particle beam 205 that has some different processing characteristic, such as beam energy, beam angle (e.g., angle 210), beam angle relative to the radial position of the substrate conveyance assembly 1007, beam composition (e.g., gas ions), or other useful property to the surface of the substrate.

In some configurations of the processing chambers 1004 or 1006, the area or region below each of the particle beam source assemblies 270 may be isolated from adjacent particle beam source assemblies 270, so that different processing environments can be maintained below each particle beam source assembly 270. In one configuration, an at least partially enclosed region (e.g., gas curtain or physical walls) is formed around each particle beam source assembly 270, such that each of the substrates 301 can be positioned within the sub-processing region by the substrate conveyance assembly 1007 and be separately processed by the particle beam source assembly 270. In some cases, each sub-processing region is configured to perform processes 254 and 256 so that a portion of each processed substrate can be sequentially removed in each sub-processing region as the substrates are serially moved through each sub-processing region by the substrate conveyance assembly 1007.

While the foregoing is directed to embodiments of the present invention, other and further embodiments of the invention may be devised without departing from the basic scope thereof, and the scope thereof is determined by the claims that follow.

The invention claimed is:

1. An apparatus for modifying a surface of a substrate, comprising:
 a chamber assembly including one or more chamber assembly walls, a volume being defined in the chamber assembly at least partially by the one or more chamber assembly walls;
 a substrate support having a substrate supporting surface, the substrate support disposed in the volume;
 an actuator that is configured to translate, in a first direction, the substrate support within a first region and between the first region and a second region, the first region and the second region being within the volume;
 a first particle beam source assembly disposed in the volume, the first particle beam source assembly comprising:
  a first plasma generation source configured to form a plasma in a capacitively-coupled plasma generation region defined by one or more plasma generation region walls, the first particle beam source assembly being configured to generate a first particle beam that is directed in a second direction towards the substrate supporting surface when the substrate support is disposed within the first region, and the second direction being at a first grazing angle relative to a third direction that is normal to the substrate supporting surface when the substrate support is disposed within the first region, wherein the first direction is at an angle to a plane that contains the second direction;
 a reactant source comprising a remote plasma source, the reactant source configured to deliver a reactant gas in the first region; and
 a modification assembly disposed in the volume and laterally displaced relative to the first particle beam source assembly, the modification assembly comprising one or more sub-region walls defining a sub-region of the volume, the modification assembly further comprising a gas distribution electrode disposed in the sub-region of the volume, the modification assembly being configured to provide a process gas through the gas distribution electrode towards the substrate supporting surface when the substrate support is disposed within the second region.

2. The apparatus of claim 1, wherein the angle is about 90° and the substrate supporting surface is maintained in a fixed orientation relative to the second direction as the substrate support is translated in the first direction within the first region.

3. The apparatus of claim 1, wherein the reactant source further comprises a process gas source that is configured to deliver the reactant gas through the remote plasma source and to the first region.

4. The apparatus of claim 3, wherein the reactant gas comprises a gas that selectively removes a portion of a modified region formed on a surface of a substrate that has been exposed to the first particle beam generated by the first particle beam source assembly.

5. The apparatus of claim 1, wherein the first particle beam source assembly further comprises a first beam extraction assembly comprising a triode configured to simultaneously generate:
 the first particle beam; and
 a second particle beam that exits the first beam extraction assembly in a fourth direction, wherein the second particle beam is directed towards the substrate supporting surface when the substrate support is disposed within the first region and the fourth direction is at a second grazing angle relative to the third direction.

6. The apparatus of claim 1, wherein the first particle beam source assembly further comprises:
 a first beam extraction assembly comprising a triode that is configured to generate the first particle beam; and
 a second beam extraction assembly that is configured to generate a second particle beam that exits the second beam extraction assembly in a fourth direction, wherein the second particle beam is directed towards the substrate supporting surface when the substrate support is disposed within the first region and the fourth direction is at a second grazing angle relative to the third direction.

7. The apparatus of claim 1, further comprising:
 an inspection module that is configured to determine an orientation of a substrate and provide information relating to the determined orientation to a system controller, wherein the system controller is configured to cause the substrate to be positioned on the substrate supporting surface in an orientation relative to the second direction based on the provided information.

8. The apparatus of claim 1, wherein the first plasma generation source further comprises an antenna disposed in the plasma generation region.

9. An apparatus for modifying a surface of a substrate, comprising:
 a chamber assembly including one or more chamber assembly walls, a volume being defined in the chamber assembly at least partially by the one or more chamber assembly walls;
 a substrate support having a substrate supporting surface, the substrate support disposed in the volume;
 an actuator that is configured to translate, in a first direction, the substrate support within a first region and between the first region and a second region, the first region and the second region being within the volume;
a first particle beam source assembly disposed in the volume, the first particle beam source assembly comprising:
   a first plasma generation source configured to form a plasma in a capacitively-coupled plasma generation region defined by one or more plasma generation region walls; and
   a first beam extraction assembly comprising a triode, the first particle beam source assembly being configured to generate a first particle beam that is directed in a second direction towards the substrate supporting surface when the substrate support is disposed within the first region, and the second direction being at a first grazing angle relative to a third direction that is normal to the substrate supporting surface when the substrate support is disposed within the first region, wherein the first direction is at an angle to a plane that contains the second direction;
a reactant source comprising a remote plasma source, the reactant source configured to deliver a reactant gas in the first region; and
a modification assembly disposed in the volume and laterally displaced relative to the first particle beam source assembly, the modification assembly comprising one or more sub-region walls defining a sub-region of the volume, the modification assembly further comprising a gas distribution electrode disposed in the sub-region of the volume, the modification assembly being configured to provide a process gas through the gas distribution electrode towards the substrate supporting surface when the substrate support is disposed within the second region.

10. The apparatus of claim 9, wherein the angle is about 90° and the substrate supporting surface is maintained in a fixed orientation relative to the second direction as the substrate support is translated in the first direction within the first region.

11. The apparatus of claim 9, wherein the reactant source further comprises a process gas source that is configured to deliver the reactant gas through the remote plasma source and to the first region.

12. The apparatus of claim 11, wherein the reactant gas comprises a gas that selectively removes a portion of a modified region formed on a surface of a substrate that has been exposed to the first particle beam generated by the first particle beam source assembly.

13. The apparatus of claim 9, wherein the first beam extraction assembly is configured to simultaneously generate:
   the first particle beam; and
   a second particle beam that exits the first beam extraction assembly in a fourth direction, wherein the second particle beam is directed towards the substrate supporting surface when the substrate support is disposed within the first region and the fourth direction is at a second grazing angle relative to the third direction.

14. The apparatus of claim 9, further comprising:
a second beam extraction assembly that is configured to generate a second particle beam that exits the second beam extraction assembly in a fourth direction, wherein the second particle beam is directed towards the substrate supporting surface when the substrate support is disposed within the first region and the fourth direction is at a second grazing angle relative to the third direction.

15. An apparatus for modifying a surface of a substrate, comprising:
a processing chamber assembly having chamber assembly walls at least partially defining a chamber volume;
plasma generation region walls at least partially defining a plasma generation region within the chamber volume;
sub-processing region walls at least partially defining a sub-process region within the chamber volume;
a substrate support disposed in the chamber volume, the substrate support having a substrate supporting surface;
an actuator configured to translate, in a first direction, the substrate support within a first region proximate the plasma generation region and between the first region and a second region proximate the sub-process region;
a particle beam source assembly disposed in the plasma generation region, the particle beam source assembly comprising a plasma generation source configured to generate a plasma in the plasma generation region, the particle beam source assembly configured to generate a particle beam from the plasma that is directed through an aperture in a wall of the plasma generation region walls and in a second direction towards the substrate supporting surface of the substrate support positioned within the first region, wherein the second direction is at a grazing angle relative to a third direction normal to the substrate supporting surface of the substrate support positioned within the first region, and the first direction is at an angle to a plane that contains the second direction;
a reactant source comprising a remote plasma source, the reactant source being configured to deliver a reactant gas between the wall of the plasma generation region walls and the substrate supporting surface of the substrate support positioned within the first region; and
a gas distribution electrode disposed in the sub-process region, the gas distribution electrode being configured to deliver a processing gas in the sub-processing region and to the substrate supporting surface of the substrate support positioned within the second region.

16. The apparatus of claim 15, wherein the plasma generation source is a capacitively coupled plasma generation source.

17. The apparatus of claim 15, wherein the angle is about 90°, and the substrate support positioned within the first region is operable to maintain the substrate supporting surface in a fixed orientation relative to the second direction as the substrate support is translated in the first direction within the first region.

18. The apparatus of claim 15, wherein the particle beam source assembly further includes a triode assembly, the triode assembly including a first electrode, a second electrode, and a third electrode that are configured to be independently biased.

19. The apparatus of claim 15, wherein the particle beam source assembly is configured to generate the particle beam as a ribbon shaped particle beam.

* * * * *